(12) United States Patent
Lee et al.

(10) Patent No.: US 10,178,760 B1
(45) Date of Patent: Jan. 8, 2019

(54) FLEXIBLE CABLE AND ELECTRONIC DEVICE WITH THE SAME

(71) Applicant: SK hynix Inc., Icheon-si (KR)

(72) Inventors: Sung-Ryong Lee, Seongnam-si (KR); Sung-Jin Lee, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/924,795

(22) Filed: Mar. 19, 2018

(30) Foreign Application Priority Data

Nov. 10, 2017 (KR) .......................... 10-2017-0149359

(51) Int. Cl.
| | |
|---|---|
| *H05K 1/02* | (2006.01) |
| *H01R 12/70* | (2011.01) |
| *H01R 12/62* | (2011.01) |
| *H05K 1/18* | (2006.01) |
| *H05K 1/14* | (2006.01) |
| *H01P 3/08* | (2006.01) |

(52) U.S. Cl.
CPC .......... *H05K 1/0242* (2013.01); *H01P 3/081* (2013.01); *H01R 12/62* (2013.01); *H01R 12/7076* (2013.01); *H05K 1/028* (2013.01); *H05K 1/0243* (2013.01); *H05K 1/142* (2013.01); *H05K 1/147* (2013.01); *H05K 1/189* (2013.01); *H05K 2201/093* (2013.01); *H05K 2201/09681* (2013.01); *H05K 2201/10121* (2013.01); *H05K 2201/10151* (2013.01)

(58) Field of Classification Search
CPC ....... H05K 1/0242; H05K 2201/09681; H05K 1/028; H05K 1/0243; H05K 1/189; H05K 1/147; H01P 3/081

USPC .......................................... 174/254; 361/749
See application file for complete search history.

(56) References Cited

U.S. PATENT DOCUMENTS

| | | | | |
|---|---|---|---|---|
| 5,360,949 A | * | 11/1994 | Duxbury ............. | H01B 7/0861 174/250 |
| 5,844,783 A | * | 12/1998 | Kojima ................ | H05K 1/0219 361/777 |
| 5,982,249 A | * | 11/1999 | Bruns ..................... | H01P 3/081 174/253 |
| 5,986,893 A | * | 11/1999 | Leigh ................... | H05K 1/0219 174/261 |
| 2005/0201072 A1 | * | 9/2005 | He .......................... | H01P 3/081 361/794 |
| 2008/0083559 A1 | * | 4/2008 | Kusamitsu ............. | H05K 3/281 174/254 |

(Continued)

FOREIGN PATENT DOCUMENTS

KR      10-1761333      7/2017

*Primary Examiner* — Sherman Ng
(74) *Attorney, Agent, or Firm* — Perkins Coie LLP (57) ABSTRACT

A flexible cable may include: a flexible substrate having a first surface and a second surface that are on opposite sides of the flexible substrate; a first conductive line formed on the first surface of the flexible substrate, and structured to transmit a signal having a first frequency; a second conductive line formed on the first surface of the flexible substrate, and structured to transmit a signal having a second frequency lower than the first frequency; and a ground line formed on the second surface of the flexible substrate, and comprising a first region overlapping the first conductive line and a second region overlapping the second conductive line. The first and second regions may have different shapes.

15 Claims, 6 Drawing Sheets

(56) References Cited

U.S. PATENT DOCUMENTS

2014/0085856 A1* 3/2014 Shirao .................. H05K 1/0251
361/803

* cited by examiner

FLEXIBLE CABLE AND ELECTRONIC DEVICE WITH THE SAME

CROSS-REFERENCE TO RELATED APPLICATIONS

This patent document claims the priority and benefits of Korean Patent Application No. 10-2017-0149359 filed on Nov. 10, 2017 in the Korean Intellectual Property Office, the disclosure of which is incorporated herein by reference in its entirety.

TECHNICAL FIELD

Exemplary embodiments of the disclosed technology relate to electronic devices, semiconductor device designs and fabrication, and more particularly, to designs and structures of flexible cables and an electronic device or system equipped with one or more flexible cables.

BACKGROUND

Electronic devices such as a computer and digital camera use a flexible cable such as a flexible printed cable (FPC) or flexible flat cable (FFC) as a relay cable for electrically connecting the two different electronic devices. Two devices that are connected via such a cable can transfer or exchange data, files or information between the devices. The materials and construction of such a cable must meet certain requirements such as the flexibility of the cable for sustaining bending and twisting during the use of the cable and certain electrical characteristics such as the impedance and transmission speed in connection with transmitting signals at different frequencies over a cable. For example, in order to have a desired bending characteristic of the flexible cable, a cable substrate as well as a conductive line may need to be designed with a small thickness.

SUMMARY

Various embodiments are directed to a flexible cable having an improved signal transmission characteristic, and an electronic device with the same.

In an embodiment, a flexible cable may include: a flexible substrate having a first surface and a second surface that are on opposite sides of the flexible substrate; a first conductive line formed on the first surface of the flexible substrate, and structured to transmit a signal having a first frequency; a second conductive line formed on the first surface of the flexible substrate, and structured to transmit a signal having a second frequency lower than the first frequency; and a ground line formed on the second surface of the flexible substrate, and comprising a first region overlapping the first conductive line and a second region overlapping the second conductive line. The first and second regions may have different shapes. The first region may have a mesh shape, and the second region may have a plane shape.

Furthermore, the flexible cable may further include: a power line formed on the second surface of the flexible substrate, and electrically isolated from the ground line; and a third conductive line formed on the first surface of the flexible substrate so as to overlap the power line, and transmitting a signal having a third frequency lower than the first frequency. The power line may have ground potential.

In an embodiment, a flexible cable may include: a flexible substrate having a first surface and a second surface on opposite surfaces of the flexible substrate; first and second conductive lines formed on the first surface of the flexible substrate and structured to carry separate first and second signals, respectively; and a ground line formed on the second surface of the flexible substrate so as to overlap the first and second conductive lines, and comprising a first region having a mesh shape. A first overlap area between the first conductive line and the ground line per unit length may be substantially equal to a second overlap area between the second conductive line and the ground line per unit length.

In an embodiment, a flexible cable is provided to include a flexible substrate having a first surface and a second surface on opposite surfaces of the flexible substrate; first and second conductive lines formed on the first surface of the flexible substrate and structured to carry separate first and second signals, respectively; and a ground line formed on the second surface of the flexible substrate so as to overlap the first and second conductive lines, and comprising a first region having a mesh shape, wherein a first overlap area between the first conductive line and the ground line per unit length is substantially equal to a second overlap area between the second conductive line and the ground line per unit length.

Furthermore, the flexible cable may further include a third conductive line formed on the first surface of the flexible substrate, and structured to carry a signal having a signal frequency lower than signal frequencies of the first and second signals. The ground line may further include a second region overlapping the third conductive line, and the second region may have a different shape from the first region. The second region may have a plane shape.

Furthermore, the flexible cable may further include: a power line formed on the second surface of the flexible substrate, and electrically isolated from the ground line; and a fourth conductive line formed on the first surface of the flexible substrate so as to overlap the power line, and structured to transmit a signal having a signal frequency lower than signal frequencies of the first and second signals. The power line may be structured to provide a ground voltage.

In an embodiment, an electronic device may include a chip module, a connector module, and a flexible cable electrically connecting the chip module and the connector module. The flexible cable may include: a flexible substrate having a first surface and a second surface facing the first surface, and including a first connection part overlapping the chip module, a second connection part overlapping the connector module, and a bending part positioned between the first and second connection parts; a plurality of signal transmission lines formed on the first surface of the flexible substrate; and a ground line formed on the second surface of the flexible substrate. Each of the signal transmission lines may include a conductive line connecting a terminal formed in the first connection part to a terminal formed in the second connection part.

The plurality of signal transmission lines may include a first conductive line transmitting a signal having a first frequency and a second conductive line transmitting a signal having a second frequency, and the ground line overlaps the first and second conductive lines, and comprises a first region having a mesh shape. A first overlap area between the first conductive line and the ground line per unit length may be substantially equal to a second overlap area between the second conductive line and the ground line per unit length. The first region may have a line shape that forms an electrically conductive path extending through the first connection part, the bending part and the second connection part. The signal having the first frequency and the signal having the second frequency may include a MIPI (Mobile Industry Processor Interface) signal.

The plurality of signal transmission lines may include a first conductive line transmitting a signal having a first frequency and a third conductive line transmitting a signal having a third frequency lower than the first frequency, and the ground line may include a first region overlapping the first conductive line and a second region overlapping the third conductive line. The first and second regions may have different shapes. The first region may have a mesh shape, and the second region may have a plane shape. The signal having the first frequency may include a MIPI signal, and the signal having the third frequency may include an I²C (Inter-Integrated Circuit) signal or DC (Direct Current) control signal.

Furthermore, the electronic device may further include a power line formed on the second surface of the flexible substrate, and electrically isolated from the ground line. The plurality of signal transmission lines may include a first conductive line transmitting a signal having a first frequency and a fourth conductive line transmitting a signal having a fourth frequency lower than the first frequency, and the fourth conductive line overlaps with the power line. The power line may have a ground potential. The signal having the first frequency may include a MIPI signal, and the signal having the fourth frequency may include an I²C (Inter-Integrated Circuit) signal or DC (Direct Current) control signal.

DETAILED DESCRIPTION

Exemplary embodiments for features of a flexible cable based on the disclosed technology are disclosed to achieve improved signal transmission characteristics and cable properties an electronic device or a system of different electronic devices equipped with such a flexible cable. In order to secure a desired bending characteristic of the flexible cable, the thickness of a cable substrate as well as a conductive line for signal transmission may be reduced in various implementations. The reduction in thickness of the conductive line and the cable substrate can increase the capacitance of the flexible cable. When the flexible cable transmits a signal under the common 50-ohm impedance matching condition, for example, a high-frequency signal in the gigahertz band, the capacitance of the flexible cable increases with the reduction in thickness of the conductive line and the cable substrate and thus can degrade the signal transmission characteristic. Thus, a signal transmitted to a high-speed interface may be distorted by a flexible cable with a conductive line at a reduced thickness, and this signal distortion limits the maximum operating speed of the flexible cable.

In order to secure the signal transmission characteristic, impedance matching of the flexible cable is performed with a target of 50Ω, for the desired impedance matching condition. However, as the thickness of the cable substrate and the conductive line become smaller, the capacitance of the flexible cable is increased, and the impedance of the flexible cable may become smaller than the desired impedance value at 50Ω. Thus, when a high-frequency signal is transmitted, a undesired signal distortion may occur. a high-frequency signal may be referred to as a high-speed signal since such a high-frequency signal can carry more data due to its high signal bandwidth.

Implementations of the disclosed technology can be designed to provide a flexible cable capable of improving the transmission characteristic of a signal requiring 50-ohm matching or a high-frequency signal for transmission of data, files or information between connected devices. For example, a flexible cable based on the disclosed technology may be implemented to have a strip-line or micro-strip structure. The electrical grounding design for such a flexible cable may include conductors for the electrical ground in different forms in different regions of the cable. For example, a ground line may include different conductors in different designs in different regions, where a plane shaped conductor be used as the ground for the cable at a location corresponding to one surface of a flexible substrate, but a ground line in a region of the cable overlapping conductive lines of the cable for transmitting high-frequency signals may have a mesh shaped conductor. Such a structure for the ground design of a flexible cable can prevent or reduce an increase in capacitance of the flexible cable even though the thicknesses of the conductive line and the flexible substrate are reduced in order to achieve desired flexibility and bending characteristic of the flexible cable. Thus, this electrical ground design for the cable can improve the signal transmission characteristic for a high-frequency signal. Furthermore, since the mesh structure of the electrical ground is applied to only a part of the ground lines, the mechanical durability and heat radiation characteristic of the flexible cable can be improved.

In the following description, an example of a flexible cable with a micro-strip structure is described. A flexible cable can be implemented in other structures such as a strip-line structure. The flexible cable with the micro-strip structure may have a structure in which conductive lines for signal transmission are formed on a side, for example, the front side of a flexible substrate and ground lines are formed on another side, for example, the back side of the flexible substrate.

Figure 1:
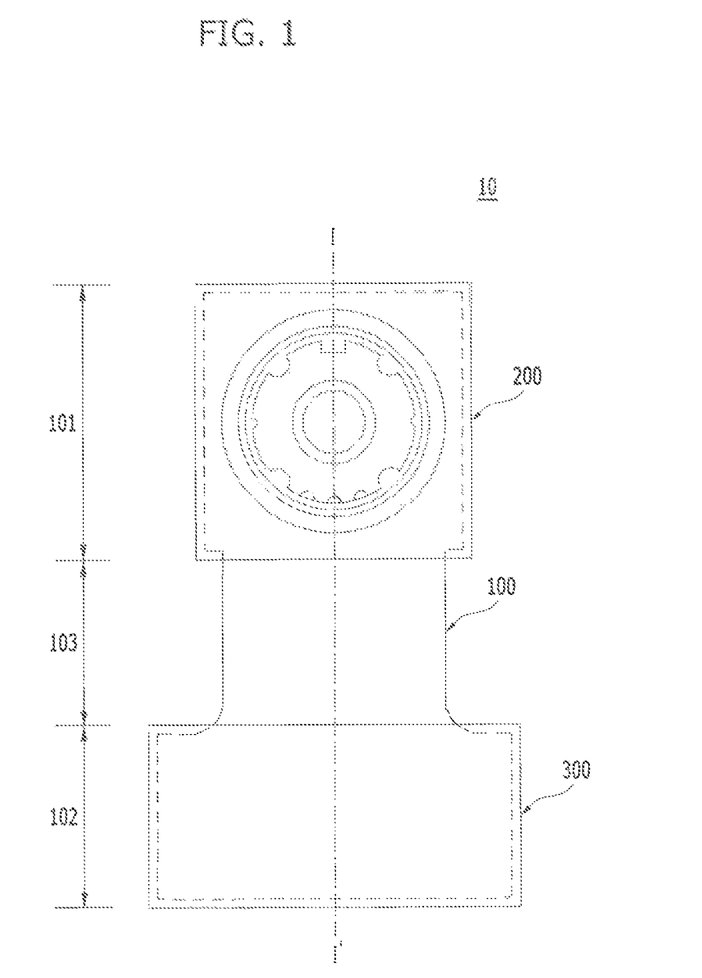
FIG. 1 is a plan view simply illustrating an exemplary electronic device with a flexible cable in accordance with an embodiment.
Figure 2:
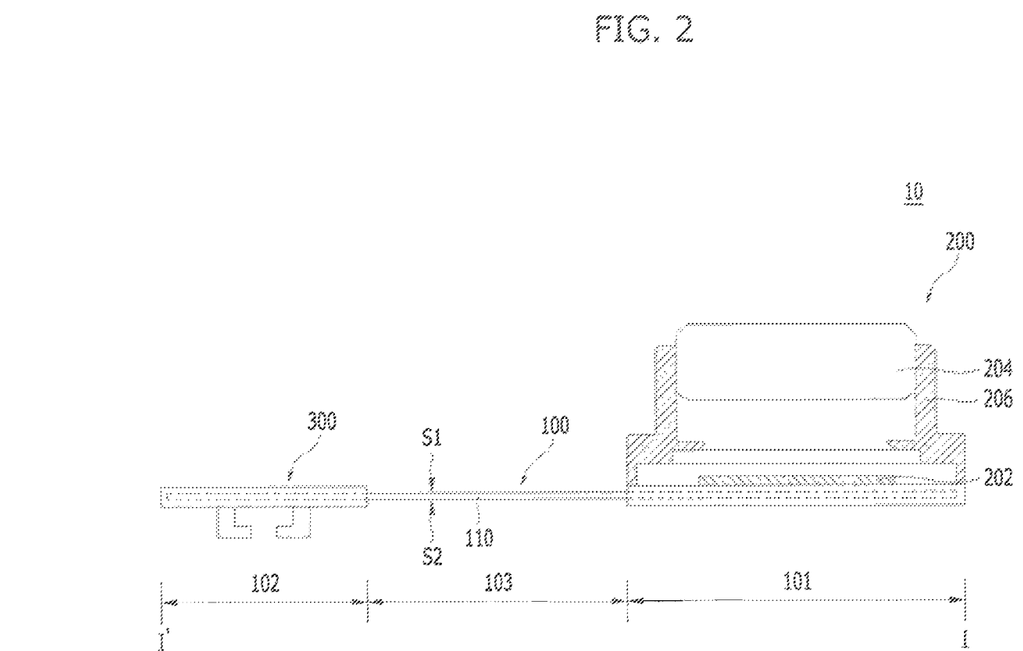
FIG. 2 is a cross-sectional view of the electronic device with the flexible cable as shown FIG. 1, taken along the line I-I' of FIG. 1.

FIGS. 1 and 2 illustrate an example of an electronic device equipped with a flexible cable in accordance with an embodiment of the disclosed technology. FIG. 1 is a plan view, and FIG. 2 is a cross-sectional view taken along the line I-I' of FIG. 1.

As illustrated in FIGS. 1 and 2, the electronic device 10 in accordance with the present embodiment may include a chip module 200, a connector module 300 and a flexible cable 100 for electrically connecting the chip module 200 and the connector module 300. The chip module 200 may be in various configurations to use the flexible cable 100 to receive or send data, files or other information. FIG. 2 illustrates a specific example where the chip module 200 includes an image sensor module having an image sensor chip 202 that converse light into electrical signals for processing and use, a module lens 204 that collects incident light and projects the collected light onto the image sensor chip 202 and a housing 206 that encloses and supports the image sensor chip 202 and the module lens 204. The connector module 300 may serve as an interface to connect an external device via the flexible cable 100 to the electronic device 10. For example, in some implementations, the connector module 300 may include a printed circuit board (PCB) with desired electrical conductive lines to connect to conductive lines in the flexible cable 100 that is linked to the chip module 200 of the device 10. In some applications, the connector module 300 may include various other modules, including various types of publicly known modules.

Referring to FIG. 2, the flexible cable 100 may include a first connection part 101 overlapping the chip module 200, a second connection part 102 overlapping the connector module 300, and a middle part 103 located between the first and second connection parts 101 and 102. In many applications, the middle part 103 should be flexible and can be bent during the use of the device 10. The flexible cable 100 may include a flexible substrate 110 having a first surface S1 on one side of the flexible substrate 100 and a second surface S2 on an opposite side so that the first surface S1 and the second surface S2 are two opposite surfaces. As illustrated in FIG. 2, each of the chip module 200 and the connector module 300 may be in contact with both of the first and second surfaces S1 and S2 of the flexible substrate 110. In other implementations of the flexible cable 100 (not illustrated), each of the chip module 200 and the connector module 300 may be in contact with the first surface S1 or the second surface S2 of the flexible substrate 110.

Certain features of the flexible cable 100 in accordance with one embodiment will be described in detail with reference to FIGS. 3 to 6.

Figure 3:
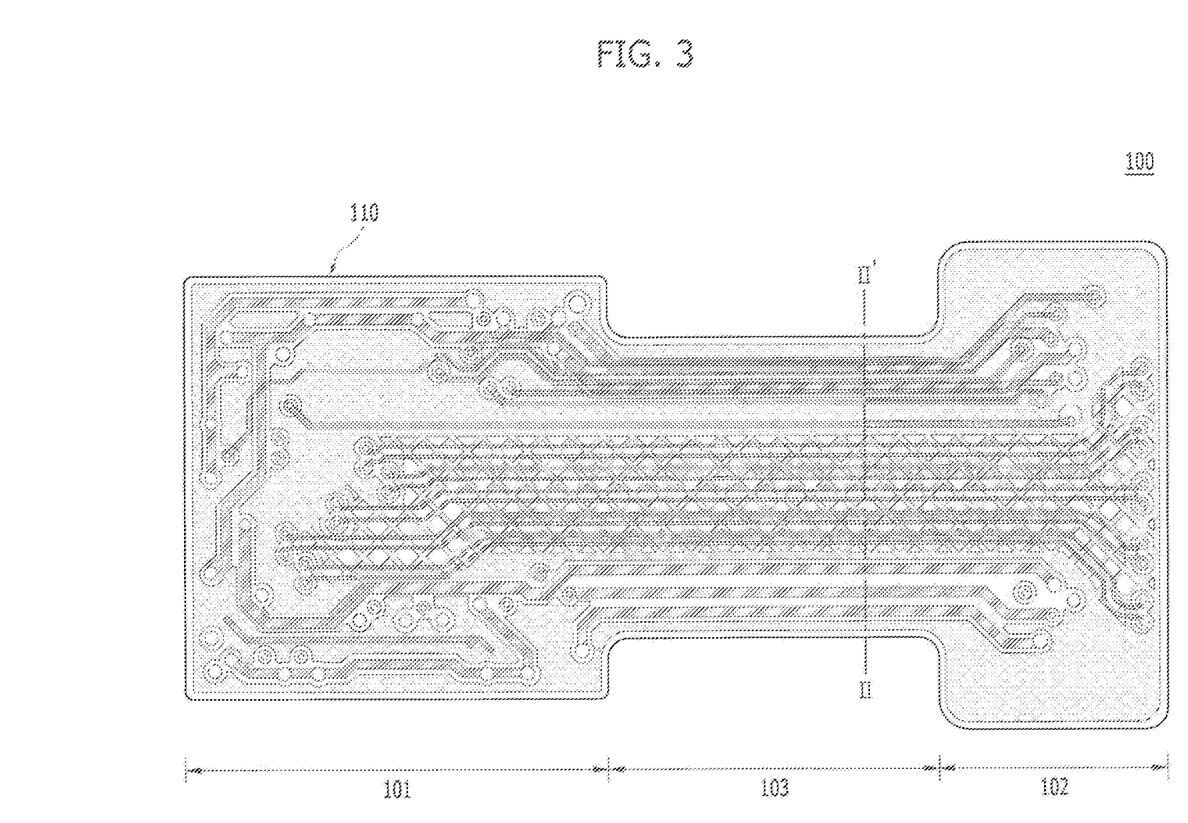
FIG. 3 is a plan view of an exemplary flexible cable in accordance with an embodiment, illustrating that first and second surfaces of a flexible substrate are overlaid.
Figure 4:
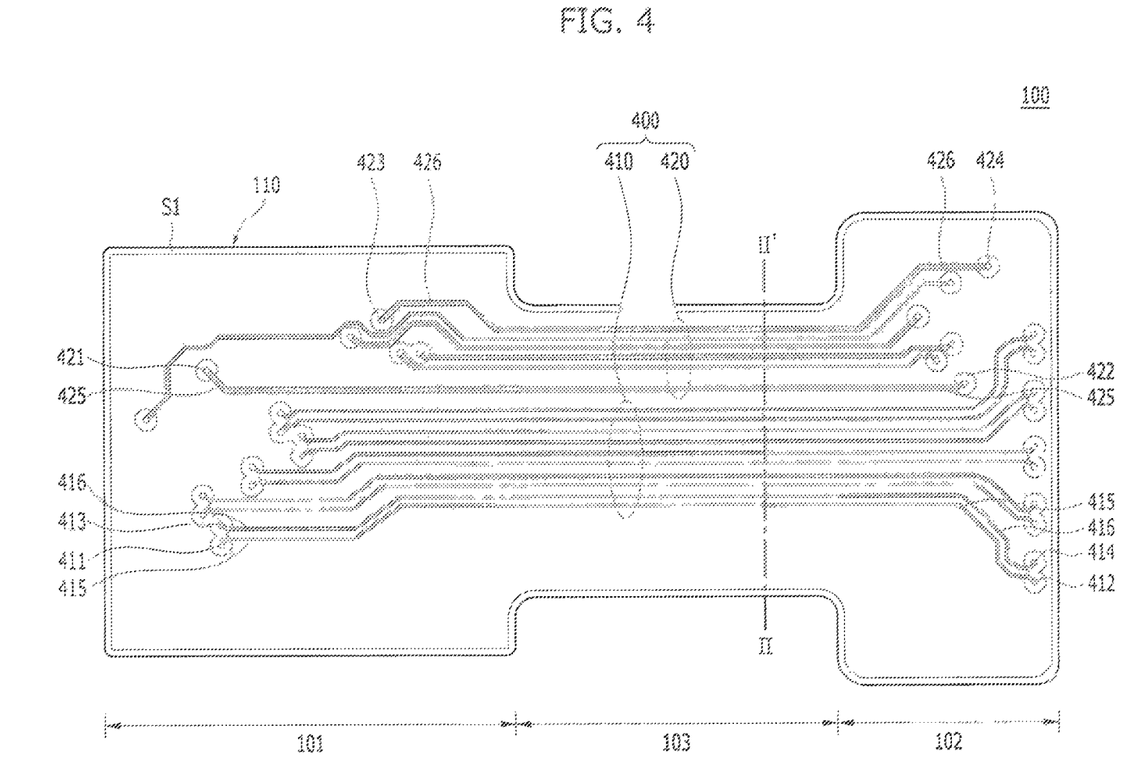
FIG. 4 is a plan view of an exemplary flexible cable in accordance with an embodiment, illustrating a first surface of a flexible substrate.
Figure 5:
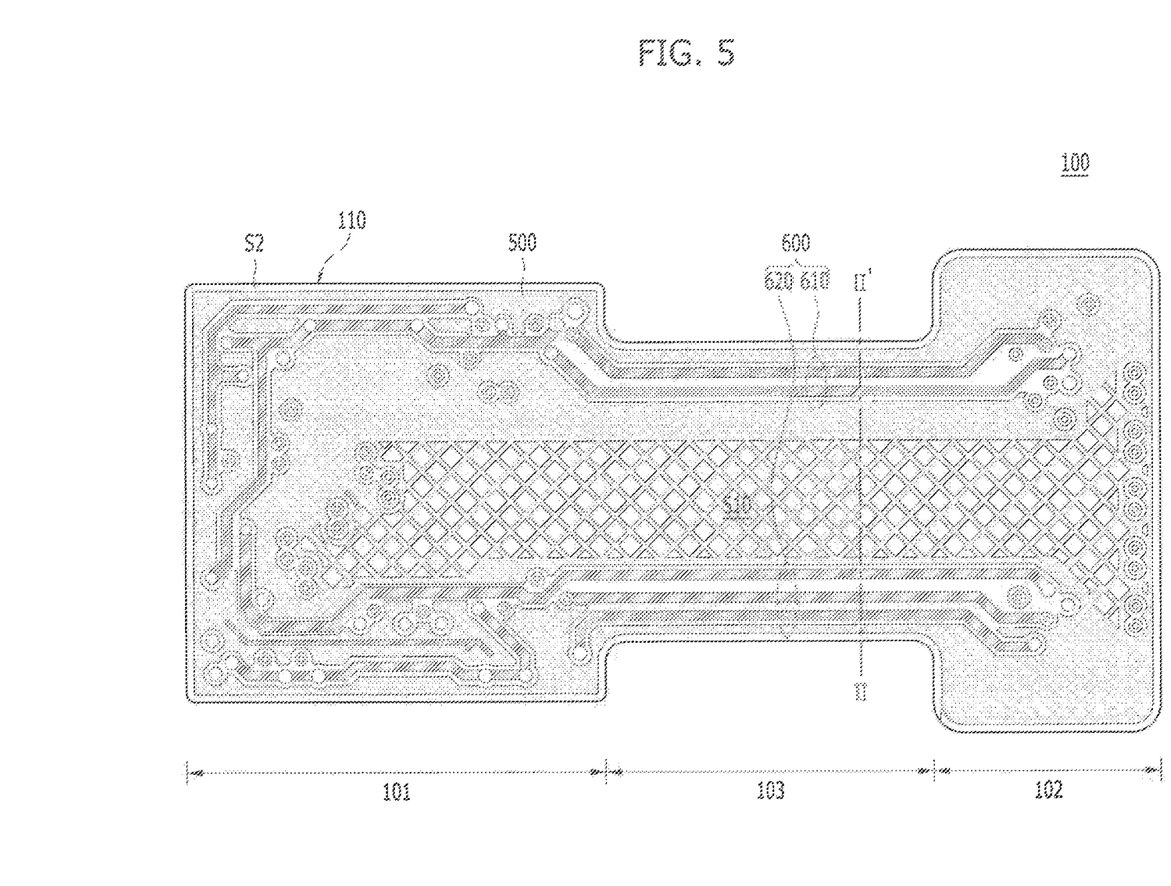
FIG. 5 is a plan view of an exemplary flexible cable in accordance with an embodiment, illustrating a second surface of a flexible substrate.
Figure 6:
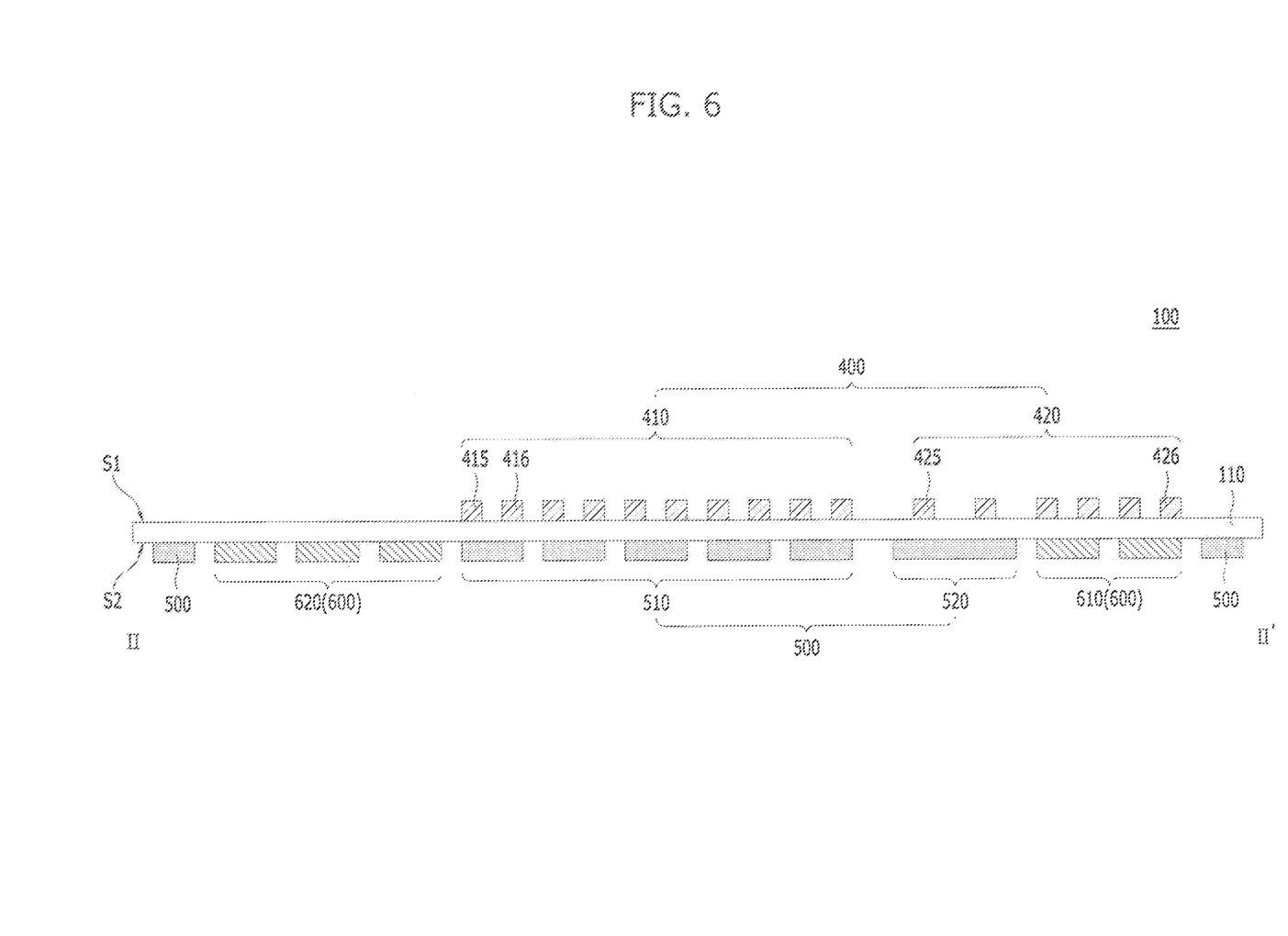
FIG. 6 is a cross-sectional view of an exemplary flexible cable in accordance with an embodiment, taken along the line II-II' of FIGS. 3 and 5.

FIGS. 3 to 5 are plan views of various examples of features of the flexible cable 100 in accordance with the present embodiment, and FIG. 6 is a cross-sectional view taken along the line II-II' of FIGS. 3 to 5. Specifically, FIG. 3 is a plan view illustrating the first and second surfaces of the flexible substrate overlapping each other, and FIGS. 4 and 5 are plan views of the first and second surfaces of the flexible substrate, respectively.

As illustrated in FIGS. 3 to 6, the flexible cable 100 in accordance with the present embodiment may include the flexible substrate 110 having the first surface S1 and the second surface S2 facing the first surface S1, a plurality of signal transmission lines 400 formed on the first surface S1 of the flexible substrate 110, and a ground line 500 formed on the second surface S2 of the flexible substrate 110. Furthermore, the flexible cable 100 in accordance with the present embodiment may further include a plurality of power lines 600 formed on the second surface S2 of the flexible substrate 110 and electrically isolated from the ground line 500. The first surface S1 of the flexible substrate 110 may be on the front side of the flexible cable 100, and the second surface S2 may be on the back side of the flexible cable 100.

A variety of materials having a bending characteristic (or flexible characteristic) may be used as the material of the flexible substrate 110. For example, the material may include synthetic resin such as nylon, polyimide, polyvinyl acetate, polyurethane, polyester, polyethylene or polypropylene.

The plurality of signal transmission lines 400 formed on the first surface S1 of the flexible substrate 110 may include high-frequency signal lines 410 for transmitting high-frequency signals and low-frequency signal lines 420 for transmitting low-frequency signals. For certain applications such as transmission of images, the high-frequency signal may indicate a signal with a frequency in the GHz range, and the low-frequency signal may indicate a signal with a frequency range in the KHz range or less. For example, the high-frequency signal may include a MIPI (Mobile Industry Processor Interface) signal. The MIPI signal may include a clock differential signal and a data differential signal. The low-frequency signal may include an $I^2C$ (Inter-Integrated Circuit) signal and a DC (Direct Current) control signal. The $I^2C$ signal may include a clock signal, data signal, the like or others, and the DC control signal may include a chip enable signal, chip identity signal, the like or others.

Each of the signal transmission lines 400 may include a conductive line for electrically connecting the first connection part 101 to the second connection part 102. For the electrical connection between the first and second connection parts 101 and 102, the first and second connection parts 101 and 102 may include terminals such that a terminal formed in the first connection part 101 is electrically connected to a terminal formed in the second connection part 102. For example, each of the signal transmission lines 400 may include a conductive line that forms an electrically conductive path extending through the first connection part 101, the bending part 103 and the second connection part 102. The terminals formed in the first connection part 101 serve to electrically connect the chip module 200 to the respective signal transmission lines 400. The terminals formed in the first connection part 101 may be connected to the chip module 200 through wire bonding. As described later, the terminals formed in the first connection part 101 may include a first terminal 411, a third terminal 413, a fifth terminal 421 and a seventh terminal 423. The terminals formed in the second connection part 102 serve to electrically connect the connector module 300 to the respective signal transmission lines 400. The terminals formed in the second connection part 102 may be connected to the connector module 300 through direct contact. As described later, the terminals formed in the second connection part 102 may include a second terminal 412, a fourth terminal 414, a sixth terminal 422 and an eighth terminal 424. For reference, in FIGS. 3 to 5, the terminals are illustrated as circles but not limited thereto.

The high-frequency signal lines 410 for transmitting high-frequency signals can be implemented in various configurations based on the needs of a particular application. For example, the flexible cable 100 in accordance with the present embodiment may include high-frequency signal lines 410 that form electrically conductive paths extending through the first connection part 101, the bending part 103 and the second connection part 102. The high-frequency signal lines 410 may transmit various data, files or information. For example, a pair of high-frequency signal lines 410 may transmit clock differential signals, and the other four pair of high-frequency signal lines 410 may transmit data differential signals.

FIG. 4 shows a specific example of the flexible cable 100 including ten high-frequency signal lines 410 two of which transmit differential signals. The number of total high-frequency signal lines in the flexible cable 100 and the number of the high-frequency signal lines operated to transmit differential signals can be changed depending on the need of a specific application. In FIG. 4, a first conductive line 415, which is one of the high-frequency signal lines, may electrically connect the first terminal 411 formed in the first connection part 101 to the second terminal 412 formed in the second connection part 102, and a second conductive line 416, which is another one of the high-frequency signal lines, may electrically connect the third terminal 413 formed in the first connection part 101 to the fourth terminal 414 formed in the second connection part 102. The first and second conductive lines 415 and 416 may be positioned adjacent to each other, and operate to transmit differential signals.

The low-frequency signal lines 420 for transmitting low-frequency signals may also implemented in various configurations based on the needs of a particular application. For example, the flexible cable 100 in accordance with the present embodiment may include low-frequency signal lines 420 that form electrical paths extending through the first connection part 101, the bending part 103 and the second connection part 102. The example of the flexible cable 100 in FIG. 4 further shows an example configuration for carrying six low-frequency signals. The number of the low-frequency signal lines in the flexible cable 100 can be implemented depending on the need of a particular application. In the illustrated example, the low-frequency signal lines 420 include conductive lines including a third conductive line 425 and a fourth conductive line 426 for electrically connecting the first connection part 101 to the second connection part 102. As shown in FIG. 4, the fourth conductive line 426 is located furthest from the third conductive line 425 along the line II-II'. For the electrical connection between the first and second connection parts 101 and 102, the first and second connection parts 101 and 102 may include terminals. The third conductive line 425 may be electrically connected to the fifth terminal 421 formed in the first connection part 101 and the sixth terminal 422 formed in the second connection part 102. The third conductive line 425 may transmit the I$^2$C signal. The fourth conductive line 426 may be electrically connected to the seventh terminal 423 formed in the first connection part 101 and the eighth terminal 424 formed in the second connection part 102. The fourth conductive line 426 may transmit the DC control signal.

The flexible cable 100 in accordance with the present embodiment may include the ground line 500 formed on the second surface S2 of the flexible substrate 110. The ground line 500 may include a first region 510 overlapping the high-frequency signal lines 410 and a second region 520 overlapping the low-frequency signal lines 420. For example, the first region 510 of the ground line 500 may overlap the first and second conductive lines 415 and 416, and the second region 520 of the ground line 500 may overlap the third and fourth conductive lines 425 and 426. The first and second regions 510 and 520 may have different shapes from each other. The different shapes of the first and second regions 510 and 520 of the ground line 500 enables to improve the mechanical durability and heat radiation characteristic while improving a transmission characteristic for a high-frequency signal. For this structure, the first region 510 of the ground line 500 overlapping the high-frequency signal lines 410 may have a mesh shape, and the second region 520 of the ground line 500 overlapping the low-frequency signal lines 420 may have a plane shape. The first region 510 of the ground line 500 may serve to secure a bending characteristic while improving a transmission characteristic for a high-frequency signal. For reference, the ground line 500 having a mesh shape may have a more excellent bending characteristic than the ground line 500 having a plane shape. The second region 520 of the ground line 500 may serve to improve the heat radiation characteristic and mechanical durability of the flexible cable 100. For reference, the ground line 500 having a plane shape may have a heat radiation characteristic and mechanical durability which are more excellent than the ground line 500 having a mesh shape. The first and second regions 510 and 520 of the ground line 500 may be integrally formed as one body. The ground line 500 may further include a third region not overlapping the high-frequency signal lines 410 and low-frequency signal lines 420. The third region of the ground lined line 500 may have a plane shape like the second region 520, and connected to the first and second regions 510 and 520.

When the first region 510 of the ground line 500 overlapping the high-frequency signal lines 410 has a mesh shape, the impedance between the ground line 500 and the high-frequency signal lines 410 can be increased because the number of loops therebetween is increased. On the other hand, since the overlap area between the high-frequency signal lines 410 and the ground line 500 is decreased, the capacitance therebetween can be reduced. Therefore, although the thicknesses of the signal transmission lines 400 and the thickness of the flexible substrate 110 are reduced in order to secure a bending characteristic, an increase in capacitance of the flexible cable 100 can be prevented, which makes it possible to improve the transmission characteristic for high-frequency signals.

When the signals transmitted through the conductive lines include multiple high-frequency signals or differential signals, if the size/shape of the ground line 500 overlapping each of the high-frequency signal lines 410 changes, the capacitance and the impedance between the ground line 500 and each of the high-frequency signal lines 410 changes as well, thereby causing a signal distortion. In order to further improve the transmission characteristic for high-frequency signals and avoid or reduce the occurrence of the signal distortion, the size per unit length of the respective high-frequency signal lines 410 overlapping with the first region 510 of the ground line 500 may be substantially equal to each other. For example, a first overlap area between the first conductive line 415 and the first region 510 of the ground line 500 per unit length may be substantially equal to a second overlap area between the second conductive line 416 and the first region 510 of the ground line 500 per unit length. Thus, an occurrence of signal distortion can be prevented.

The first region 510 of the ground line 500 may have a line shape that form an electrical path extending through the first connection part 101, the bending part 103 and the second connection part 102 so as to correspond to the high-frequency signal lines 410. Thus, the first region 510 may overlap the high-frequency signal lines 410. Such a structure can improve the signal transmission characteristic for a high-frequency signal more effectively. Furthermore, the structure where the first region 510 of the ground line 500 overlapping the high-frequency signal lines 410 has a mesh shape can suppress a reduction in heat radiation characteristic and mechanical durability of the ground line 500 as explained below.

In a first comparative example, the ground line corresponding to the flexible or bending part may have a mesh shape in order to secure the bending characteristic and the signal transmission characteristic for a high-frequency signal. In this case, since the ground line in an unnecessary region, for example, the region overlapping the low-frequency signal lines also has a mesh shape, the heat radiation characteristic and mechanical durability may be reduced. In a second comparative example, the entire ground line corresponding to the first connection part, the bending part and the second connection part may have a mesh shape in order to secure the bending characteristic and the signal transmission characteristic for a high-frequency signal. In this case, the signal transmission characteristic can be improved more than in the first comparative example, but the heat radiation characteristic and mechanical durability may be considerably degraded. In the flexible cable 100 in accordance with the present embodiment, only the first region 510 of the ground line 500 corresponding to the high-frequency signal lines 410 may have a mesh shape. Thus, the flexible cable 100 can prevent the reduction of heat radiation characteristic and mechanical durability which occurred in the first and second comparative examples.

The flexible cable 100 in accordance with the present embodiment may include the plurality of power lines 600 formed on the second surface S2 of the flexible substrate 110. The plurality of power lines 600 may include first power lines 610 for providing a ground voltage and second power lines 620 for providing a positive voltage higher than the ground voltage. The first power lines 610 and the second power lines 620 are arranged on different sides of the first region 510 of the ground line 500. The plurality of power lines 600 may be separated from the ground line 500 and electrically isolated from the ground line 500.

The second power lines 620 for providing a positive voltage may not overlap the plurality of signal transmission lines 400. On the other hand, the first power lines 610 for providing the ground voltage may overlap the low-frequency signal lines 420. In the flexible cable 100, the bending part 103 has a smaller line width than the first and second connection parts 101 and 102. Since the plurality of power lines 600 and the plurality of signal transmission lines 400 need to be arranged in the bending part 103, a part of the low-frequency signal lines 420 may overlap the first power lines 610 having the ground potential. As an example, FIGS. 3 and 6 show that there are four low-frequency signal lines 420 overlapping the first power lines 610. The four low-frequency signal lines 420 overlapping the first power lines 610 include the fourth conductive line 426. For reference, in the present embodiment, a part of the fourth conductive line 426 may overlap the first power lines 610, and the other part of the fourth conductive line 426 may overlap the ground line 500. In some implementations, the entire fourth conductive line 426 may overlap the first power lines 610.

As described above, the ground line 500 of the flexible cable 100 in accordance with the present embodiment may have a plane shape, and only the first region 510 overlapping the high-frequency signal lines 410 may have a mesh shape, which makes it possible to improve the transmission characteristic for a high-frequency signal, the mechanical durability and the heat radiation characteristic.

Furthermore, when the flexible cable 100 in accordance with the present embodiment is applied, it is possible to provide an electronic device 10 capable of performing a high-speed operation.

In the present embodiment, the flexible cable with a micro-strip structure has been taken as an example, for convenience of description. However, the present embodiment is not limited thereto. Thus, the present embodiment may be applied to a flexible cable with a strip-line structure. For reference, the flexible cable with a strip-line structure may have a structure in which first and second ground lines are formed at the top and bottom of a conductive line for signal transmission. Between the first and second ground lines and the conductive line, an insulation film may be inserted. Furthermore, the flexible cable with a strip-line structure may indicate a multilayer flexible cable in which a plurality of flexible substrates, a plurality of conductive lines for signal transmission and a plurality of ground lines are stacked.

In accordance with the embodiments, the flexible cable may have a structure in which the ground line has a plane shape and only the part of the ground overlapping the high-frequency signal lines has a mesh shape. Thus, the flexible cable can improve the transmission characteristic for a high-frequency signal, the mechanical durability and the heat radiation characteristic.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. A flexible cable comprising: a flexible substrate having a first surface and a second surface that are on opposite sides of the flexible substrate; a first conductive line formed on the first surface of the flexible substrate, and structured to transmit a signal having a first frequency; a second conductive line formed on the first surface of the flexible substrate, and structured to transmit a signal having a second frequency lower than the first frequency; and a ground line formed on the second surface of the flexible substrate, and comprising a first region overlapping the first conductive line and a second region overlapping the second conductive line, wherein the first and second regions have different shapes, wherein the first region has a mesh shape, and the second region has a plane shape.

2. The flexible cable of claim 1, further comprising: a power line formed on the second surface of the flexible substrate, and electrically isolated from the ground line; and a third conductive line formed on the first surface of the flexible substrate so as to overlap the power line, and transmitting a signal having a third frequency lower than the first frequency.

3. The flexible cable of claim 2, wherein the power line has a ground potential.

4. A flexible cable comprising: a flexible substrate having a first surface and a second surface on opposite surfaces of the flexible substrate; first and second conductive lines formed on the first surface of the flexible substrate and structured to carry separate first and second signals, respectively; a ground line formed on the second surface of the flexible substrate so as to overlap the first and second conductive lines, and comprising a first region having a mesh shape, wherein a first overlap area between the first conductive line and the ground line per unit length is substantially equal to a second overlap area between the second conductive line and the ground line per unit length; a third conductive line formed on the first surface of the flexible substrate, and structured to carry a signal having a signal frequency lower than signal frequencies of the first and second signals, wherein the ground line further comprises a second region overlapping the third conductive line, and the second region has a different shape from the first region, wherein the second region has a plane shape.

5. The flexible cable of claim 4, further comprising: a power line formed on the second surface of the flexible substrate, and electrically isolated from the ground line; and a fourth conductive line formed on the first surface of the flexible substrate so as to overlap the power line, and structured to transmit a signal having a signal frequency lower than signal frequencies of the first and second signals.

6. The flexible cable of claim 5, wherein the power line is structured to provide a ground voltage.

7. An electronic device comprising a chip module, a connector module, and a flexible cable electrically connecting the chip module and the connector module, wherein the flexible cable comprises: a flexible substrate having a first surface and a second surface facing the first surface, and comprising a first connection part overlapping the chip module, a second connection part overlapping the connector module, and a bending part positioned between the first and second connection parts; a plurality of signal transmission lines formed on the first surface of the flexible substrate; a ground line formed on the second surface of the flexible substrate, wherein each of the signal transmission lines comprises a conductive line connecting a terminal formed in the first connection part to a terminal formed in the second connection part, wherein the plurality of signal transmission lines comprises a first conductive line transmitting a signal having a first frequency, a second conductive line transmitting a signal having a second frequency, and a third conductive line transmitting a signal having a third frequency lower than the first frequency, wherein the ground line comprises a first region overlapping the first and second conductive lines and a second region overlapping the third conductive line, wherein the first region has a mesh shape, and the second region has a plane shape.

8. The electronic device of claim 7, wherein a first overlap area between the first conductive line and the ground line per unit length is substantially equal to a second overlap area between the second conductive line and the ground line per unit length.

9. The electronic device of claim 7, wherein the first region has a line shape that forms an electrically conductive path extending through the first connection part, the bending part and the second connection part.

10. The electronic device of claim 7, wherein the signal having the first frequency and the signal having the second frequency comprise a MIPI (Mobile Industry Processor Interface) signal.

11. The electronic device of claim 7, wherein the signal having the first frequency comprises a MIPI signal, and the signal having the third frequency comprises an I2C (Inter-Integrated Circuit) signal or DC (Direct Current) control signal.

12. The electronic device of claim 7, further comprising a power line formed on the second surface of the flexible substrate, and electrically isolated from the ground line.

13. The electronic device of claim 12, wherein the plurality of signal transmission lines comprises a first conductive line transmitting a signal having a first frequency and a fourth conductive line transmitting a signal having a fourth frequency lower than the first frequency, and the fourth conductive line overlaps with the power line.

14. The electronic device of claim 13, wherein the power line has a ground potential.

15. The electronic device of claim 13, wherein the signal having the first frequency comprises a MIPI signal, and the signal having the fourth frequency comprises an I2C (Inter-Integrated Circuit) signal or DC (Direct Current) control signal.

* * * * *